(12) United States Patent
Mimura (10) Patent No.: US 10,409,303 B2
(45) Date of Patent: Sep. 10, 2019

(54) TEMPERATURE CONTROLLER OF SEMICONDUCTOR WAFER AND TEMPERATURE CONTROL METHOD OF SEMICONDUCTOR WAFER

(71) Applicant: Kelk Ltd., Hiratsuka-shi, Kanagawa (JP)

(72) Inventor: Kazuhiro Mimura, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 57 days.

(21) Appl. No.: 15/459,221

(22) Filed: Mar. 15, 2017

(65) Prior Publication Data

US 2017/0269616 A1    Sep. 21, 2017

(30) Foreign Application Priority Data

Mar. 16, 2016 (JP) .................. 2016-052462

(51) Int. Cl.
*G05B 13/02* (2006.01)
*G05D 23/19* (2006.01)
*H01L 21/67* (2006.01)

(52) U.S. Cl.
CPC ... *G05D 23/1917* (2013.01); *H01L 21/67103* (2013.01); *H01L 21/67248* (2013.01); *G05B 2219/45031* (2013.01)

(58) Field of Classification Search
CPC ...... G05B 13/048; G05B 11/42; G05B 13/04; G05B 11/32; G05B 13/0205; G05B 13/041; G05D 23/1931; G05D 23/1919; G05D 23/1934; G05D 23/22; H01L 21/67248; H01L 21/324; H01L 21/67098; G06F 17/10
See application file for complete search history.

(56) References Cited

U.S. PATENT DOCUMENTS 5,568,378 A * 10/1996 Wojsznis ............. G05B 13/048
                                                                    700/44
5,895,596 A *  4/1999 Stoddard ................. C23C 16/52
                                                                    118/725

(Continued)

FOREIGN PATENT DOCUMENTS

JP       2016-012228       1/2016

*Primary Examiner* — Darrin D Dunn
(74) *Attorney, Agent, or Firm* — Fish & Richardson P.C.

(57) ABSTRACT

A manipulated variable calculator having a plurality of control loops and configured to calculate manipulated variables to be respectively given to a plurality of temperature adjusters includes: a reference model output generator configured to generate a reference model that is a response output until reaching a temperature setpoint when, in the plurality of control loops, a manipulated variable of a control loop having the slowest response speed is defined as 100%; a simulator configured to sequentially search for a switching time to determine a manipulated variable pattern; a reference model configured to generate a reference model output based on the searched switching time; and a control switching unit configured to switch to a feed-back control using an error between the reference model outlet and the temperature setpoint when the reference model outlet reaches a predetermined time or a predetermined temperature after the reference model outlet starts.

2 Claims, 11 Drawing Sheets

(56) References Cited

U.S. PATENT DOCUMENTS

| | | | | |
|---|---|---|---|---|
| 6,207,936 B1* | 3/2001 | de Waard | G05B 13/027 | 219/412 |
| 6,373,033 B1* | 4/2002 | de Waard | G05B 13/027 | 219/483 |
| 6,911,628 B1* | 6/2005 | Hirayama | G05B 5/01 | 219/483 |
| 7,006,900 B2* | 2/2006 | Zhenduo | G05B 11/42 | 165/289 |
| 7,415,312 B2* | 8/2008 | Barnett, Jr. | G05D 23/1931 | 219/390 |
| 7,599,751 B2* | 10/2009 | Cutler | G05B 13/041 | 700/266 |
| 7,894,927 B2* | 2/2011 | Funk | H01L 22/12 | 430/5 |
| 8,131,404 B2* | 3/2012 | Okada | H01L 21/67248 | 700/299 |
| 8,255,091 B2* | 8/2012 | Hsieh | G05D 23/24 | 219/494 |
| 8,756,039 B2* | 6/2014 | Coughran | G05B 17/02 | 703/2 |
| 9,259,761 B2* | 2/2016 | Takenaga | B05D 3/0218 | |
| 9,798,308 B2* | 10/2017 | Mimura | H01L 21/67248 | |
| 2002/0095278 A1* | 7/2002 | Riley | H01L 22/20 | 703/2 |
| 2003/0202910 A1* | 10/2003 | Sinha | C01B 3/14 | 422/105 |
| 2004/0098145 A1* | 5/2004 | Zhenduo | G05B 11/42 | 700/42 |
| 2004/0149714 A1* | 8/2004 | Choi | H01L 21/67115 | 219/390 |
| 2005/0004685 A1* | 1/2005 | Seem | G05B 11/42 | 700/41 |
| 2005/0221514 A1* | 10/2005 | Pasadyn | G05B 11/42 | 438/14 |
| 2005/0247266 A1* | 11/2005 | Patel | C23C 16/345 | 118/719 |
| 2005/0267606 A1* | 12/2005 | Bartlett, Jr. | G05B 13/042 | 700/29 |
| 2008/0215283 A1* | 9/2008 | Sri-Jayantha | G06F 1/206 | 702/130 |
| 2010/0172383 A1* | 7/2010 | Montalvo | H01S 5/0683 | 372/38.01 |
| 2015/0212528 A1* | 7/2015 | Mimura | H01L 21/67248 | 700/300 |
| 2015/0323912 A1* | 11/2015 | Shamsuzzoha | G06F 17/10 | 700/37 |

* cited by examiner

TEMPERATURE CONTROLLER OF SEMICONDUCTOR WAFER AND TEMPERATURE CONTROL METHOD OF SEMICONDUCTOR WAFER

The entire disclosure of Japanese Patent Application No. 2016-052462 filed Mar. 16, 2016 is expressly incorporated by reference herein.

TECHNICAL FIELD

The present invention relates to a temperature controller of a semiconductor wafer and a temperature control method of a semiconductor wafer.

BACKGROUND ART

A process for treating a semiconductor wafer (e.g., a silicon wafer) used for a semiconductor includes controlling an in-plane temperature distribution of the semiconductor wafer as desired while controlling a temperature of the semiconductor wafer to a temperature setpoint.

Accordingly, the temperature of the semiconductor wafer is typically controlled to a desired temperature by providing a plurality of temperature adjusters and control loops to the respective temperature adjusters and independently controlling the temperature adjusters with the control loops. As one of such multi-input multi-output control methods, a model following servo control method is used.

The model following servo control method includes: selecting a model (e.g., a second-order lag system) having dynamic characteristics generally desired as a reference model; and providing a setpoint response to make a control variable to follow a step response of the reference model as a reference trajectory.

In order to improve a throughput in the process, it is desirable to intentionally saturate the manipulated variable to reach a setpoint at the maximum speed in the shortest time.

Patent Literature 1 (JP2016-12228A) discloses a technology of generating a reference model based on a response in which, in a plurality of control loops, a manipulated variable of a first control loop having the slowest response speed is defined as 100% and the rest of the control loops is controlled to follow the first control loop; with use of the generated reference model, searching for a manipulated variable pattern, using a predetermined evaluation function, for reaching the temperature setpoint in the shortest time; giving a manipulated variable of the searched optimal manipulated variable pattern to the reference model to obtain an output; and using the obtained output as a reference model output.

However, since the technology of Patent Literature 1 includes searching for a switching time allowable for the minimum evaluation function, in other words, a switching time allowable for a small overshoot and a short setting time, the obtained results do not always completely conform with a setpoint, which entails a problem that there is a possibility to cause an error with respect to the setpoint.

SUMMARY OF THE INVENTION

An object of the invention is to provide a temperature controller and a temperature control method of a semiconductor wafer which can bring a reference model output into complete conformity with a temperature setpoint in a model following servo control.

An aspect of the invention is a temperature controller of a semiconductor wafer using a plurality of temperature adjusters, the temperature controller configured to control temperatures of the respective temperature adjusters to adjust temperatures of the semiconductor wafer, the temperature controller including: a plurality of control loops respectively set in the plurality of temperature adjusters; a plurality of temperature detectors provided to the respective control loops and configured to detect the temperatures of the semiconductor wafer, the temperatures adjusted by the respective temperature adjusters; and a manipulated variable calculator configured to calculate manipulated variables to be respectively given to the temperature adjusters of the control loops based on the temperatures detected by the temperature detectors, the manipulated variable calculator executing: a reference model generated based on a response in which, in the plurality of control loops, a manipulated variable of a first control loop having the slowest response speed is defined as 100% and the rest of the control loops is controlled to follow the first control loop; an optimal manipulated variable pattern searching unit configured to search, online or in advance offline using the reference model, an optimal manipulated variable pattern for reaching a temperature setpoint in the shortest time; a reference model output generator configured to give to the reference model a manipulated variable of the optimal manipulated variable pattern searched by the optimal manipulated variable pattern searching unit; a model following servo calculator configured to use an outlet of the reference model obtained by the reference model output generator as a reference model outlet; and a control switching unit configured to feed back an error between the reference model outlet and the temperature setpoint when the reference model outlet reaches a predetermined time or a predetermined temperature after the reference model outlet starts, thereby switching to a feed-back control to reset the error to zero.

Another aspect of the invention is a temperature control method of a semiconductor wafer using a temperature controller including a plurality of temperature adjusters and configured to adjust temperatures of the semiconductor wafer using the plurality of temperature adjusters, the temperature control method including: controlling temperatures of the respective temperature adjusters to adjust temperatures of the semiconductor wafer, the temperature controller further including: a plurality of control loops respectively set in the plurality of temperature adjusters; a plurality of temperature detectors provided to the respective control loops and configured to detect the temperatures of the semiconductor wafer, the temperatures adjusted by the respective temperature adjusters; and a manipulated variable calculator configured to calculate manipulated variables to be respectively given to the temperature adjusters of the control loops based on the temperatures detected by the temperature detectors, the manipulated variable calculator executing: searching online or offline in advance for an optimal manipulated variable pattern to reach a temperature setpoint in the shortest time with use of a reference model generated based on a response in which, in the plurality of control loops, a manipulated variable of a first control loop having the slowest response speed is defined as 100% and the rest of the control loops is controlled to follow the first control loop; giving to the reference model a manipulated variable of the searched optimal manipulated variable pattern; executing model following servo calculation by using an outlet of the obtained reference model as a reference model outlet to calculate a manipulated variable with respect to a control target; and feeding back an error between the reference model outlet and the temperature setpoint when the reference model outlet reaches a predetermined time or a predetermined temperature after the reference model outlet starts, thereby switching to a feed-back control to reset the error to zero.

According to the above aspects of the invention, since the reference model output can be brought into complete conformity with the temperature setpoint, when the temperature of the semiconductor wafer is made steady by the temperature adjusters, the temperature of the semiconductor wafer following the reference model output can be in complete conformity with the temperature setpoint.

DESCRIPTION OF EMBODIMENT(S)

Exemplary embodiment(s) of the invention will be described below with reference to the attached drawings.

[1] Structure of Temperature Adjustment Apparatus 1

Figure 1:
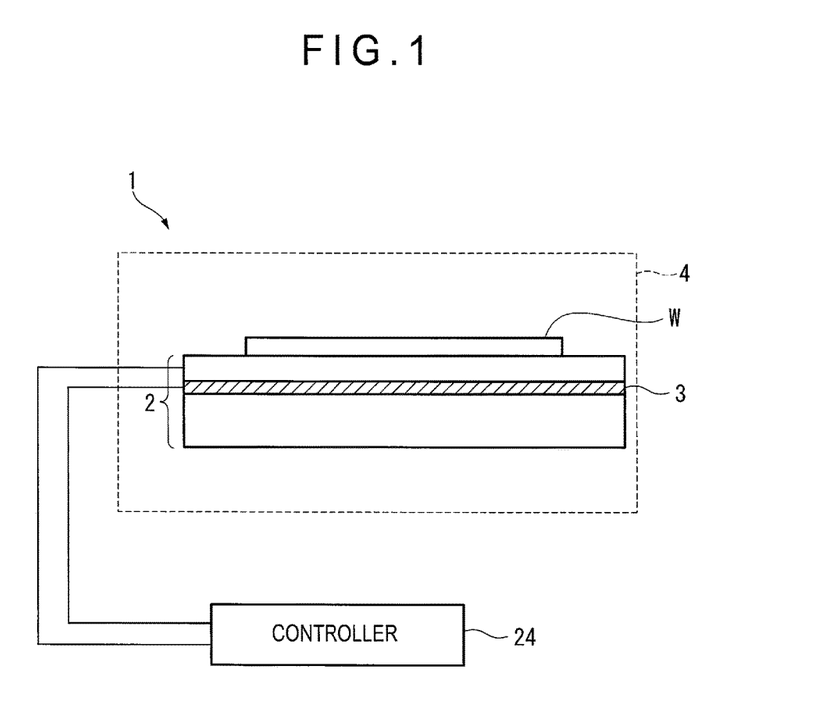
FIG. 1 is a block diagram showing a temperature adjustment apparatus according to an exemplary embodiment of the invention.

FIG. 1 shows a temperature adjustment apparatus 1 according to a first exemplary embodiment of the invention. The temperature adjustment device 1 controls a temperature of a silicon wafer W placed on a plate-shaped stage 2 to a temperature setpoint to control an in-plane temperature distribution of the silicon wafer W. The temperature adjustment apparatus 1 is used, for instance, in a dry etching process.

The temperature adjustment device 1 includes the plate-shaped stage 2 and a temperature adjuster 3. It should be noted that the temperature adjuster 3 for controlling by heating and cooling is preferably in a form of a chiller device and a thermoelectric element. When the temperature adjuster 3 is used only for heating, a heater is usable as the temperature adjuster 3.

The stage 2 is disposed in a vacuum chamber 4. The silicon wafer W (semiconductor wafer) is placed on the stage 2. The silicon wafer W is electrostatically held on the stage 2. It should be noted that helium gas may be delivered between the stage 2 and the silicon wafer W to enhance efficiency in heat transfer between the stage 2 and the silicon wafer W.

In the dry etching process, the vacuum chamber 4 is air-purged to be kept at a predetermined low pressure state.

Figure 2A:
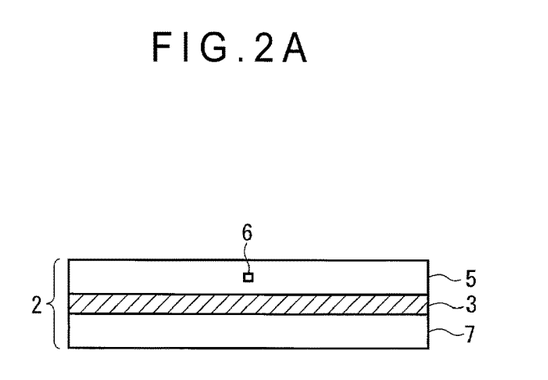
FIG. 2A is a cross-sectional view showing the arrangement of a temperature adjuster and a temperature sensor in the exemplary embodiment.
Figure 2B:
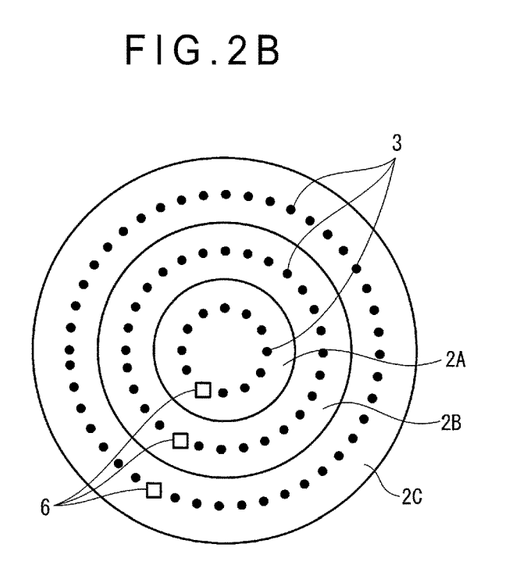
FIG. 2B is a plan view showing the arrangement of a temperature adjuster and a temperature sensor in the exemplary embodiment.

In the stage 2, a plurality of temperature adjusters 3 are disposed as shown in FIGS. 2A and 2B so as to adjust the in-plane temperature distribution of the silicon wafer W placed on the stage 2.

FIG. 2A is a cross-sectional view of the stage 2. The temperature adjusters 3 are disposed on a base plate 7. A plate 5 is placed on the temperature adjusters 3. A plurality of temperature sensors 6 (temperature detectors) are disposed in the plate 5.

FIG. 2B is a plan view of the stage 2, showing that the stage 2 is divided into three concentric zones 2A (a zone 1 described later), 2B (a zone 2 described later) and 2C (a zone 3 described later), in each of which the temperature adjusters 3 are disposed. The temperature sensors 6 (temperature detectors) in the plate 5 are disposed at positions corresponding to the temperature adjusters 3.

When the plurality of temperature adjusters 3 are electrified, the zones 2A, 2B and 2C of the stage 2 can be independently heated or cooled by the plurality of control loops. Accordingly, by adjusting electrification to the temperature adjusters 3 to control the temperature adjusters 3, the in-plane temperature distribution of the silicon wafer W on the stage 2 is adjustable. The temperature adjusters 3 in each of the zones 2A, 2B and 2C are controlled by a controller 24 serving as a temperature controller.

2. Structure of Controller 24

Figure 3:
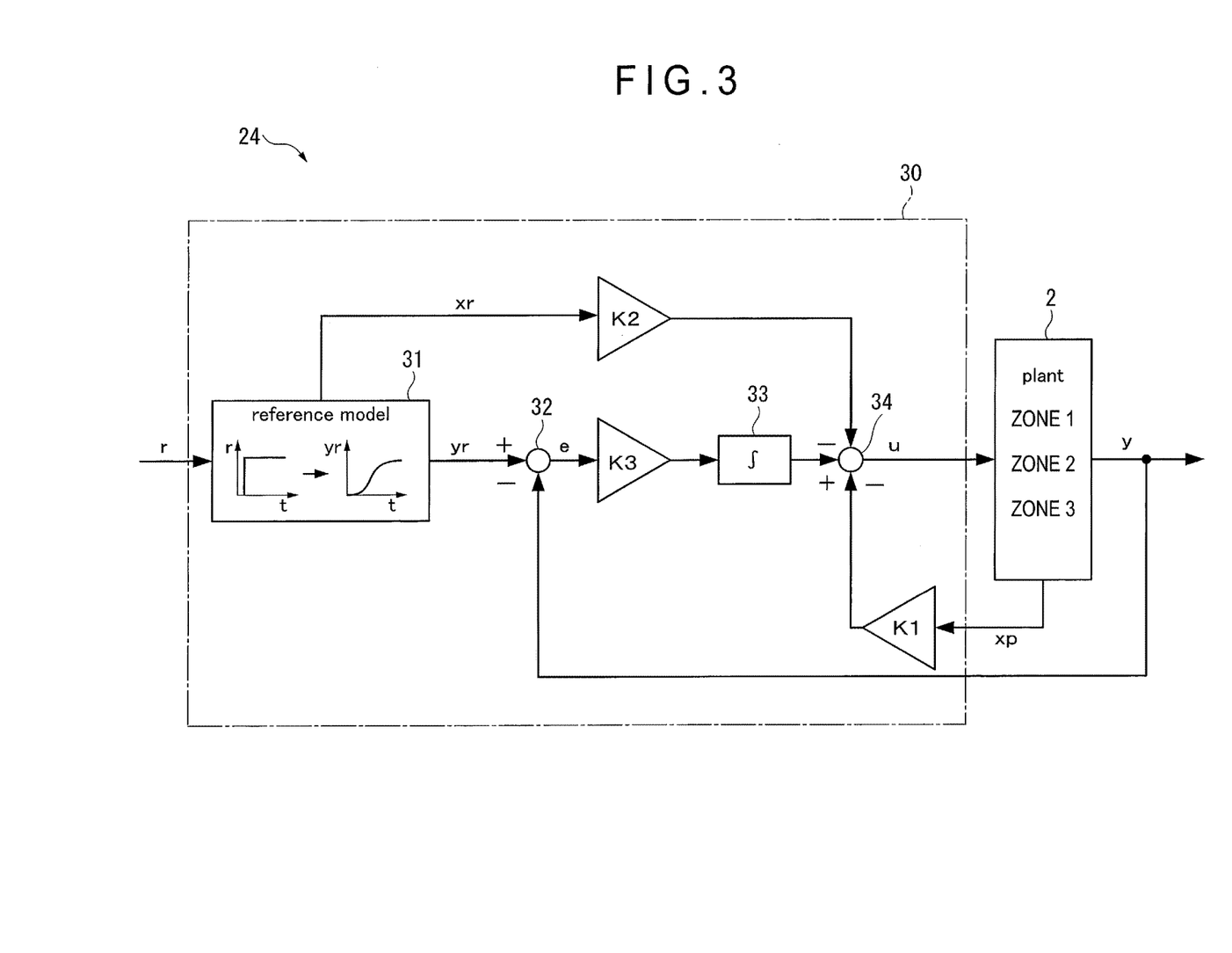
FIG. 3 is a block diagram showing a configuration of a controller configured to control the temperature adjustment apparatus in the exemplary embodiment.

FIG. 3 shows a block diagram showing the controller 24 in the exemplary embodiment. The controller 24 includes a manipulated variable calculator 30 serving as a manipulated variable calculating unit. The manipulated variable calculator 30 includes: a reference model output generator 31 serving as a reference model output unit; an error calculator 32 serving as a model following servo calculator; an integrator 33; and an error calculator 34. The manipulated variable calculator 30 is configured to perform a typical model following control. A state feedback gain K1 is set for an output from the temperature sensor 6 of the stage 2. A state feedforward gain K2 is set for an output from the reference model output generator 31. A gain K3 is set for the integrator 33. An input/output to each of the components in each of the block diagrams is shown below.

r: temperature setpoint
yr: reference trajectory
xr: state quantity of a reference model
error: error
u: manipulated variable
y: control variable (temperature)
xp: state quantity of a control target It should be noted that, though the state quantity xp of the control target is directly observable in FIG. 3, an estimation value obtained from an estimator and the like may be used in place of the state quantity xp when the control target is not observable.

Given that the stage 2 (control target) is controlled by multi-input multi-output in a form of an m-input m-output system, a state variable of the control target is expressed by formulae (1) and (2) below.

$$x_p(k+1)=A_p x_p(k)+B_p u(k) \tag{1}$$

$$y(k)=C_p x_p(k) \tag{2}$$

wherein $x_p$: n×1, u: m×1, y: m×1, $A_p$: n×n, $B_p$: n×m, $C_p$: m×n each of which shows a vector or a matrix.

Herein, the gain matrixes K1, K2 and K3 are represented by a formula (3) below. p depends on an order of the reference model.

$$\text{K1: m×n, K2: m×p, K3: m×m} \tag{3}$$

The reference model 33 selectively employs a linear system (a state equation and a transfer function) having a desired response (dynamic characteristics), in which control variables are made to follow a step response without an error. In the multi-input multi-output system, as long as the same reference model is used for all the loops, a response follows the same reference trajectory, so that uniformity among the loops can be expected.

The gains (K1, K2, K3) of each of the components are determined according to an optimal control method. This method is applicable with merits of the optimal control (i.e., stability guaranty and robustness) and without considering decoupling and is suitable for the multi-input multi-output system with interaction such as the control target described herein.

In the exemplary embodiment, an ideal response for the requirement of "reaching a temperature setpoint in the shortest time" is obtained in the following manner.

Figure 4:
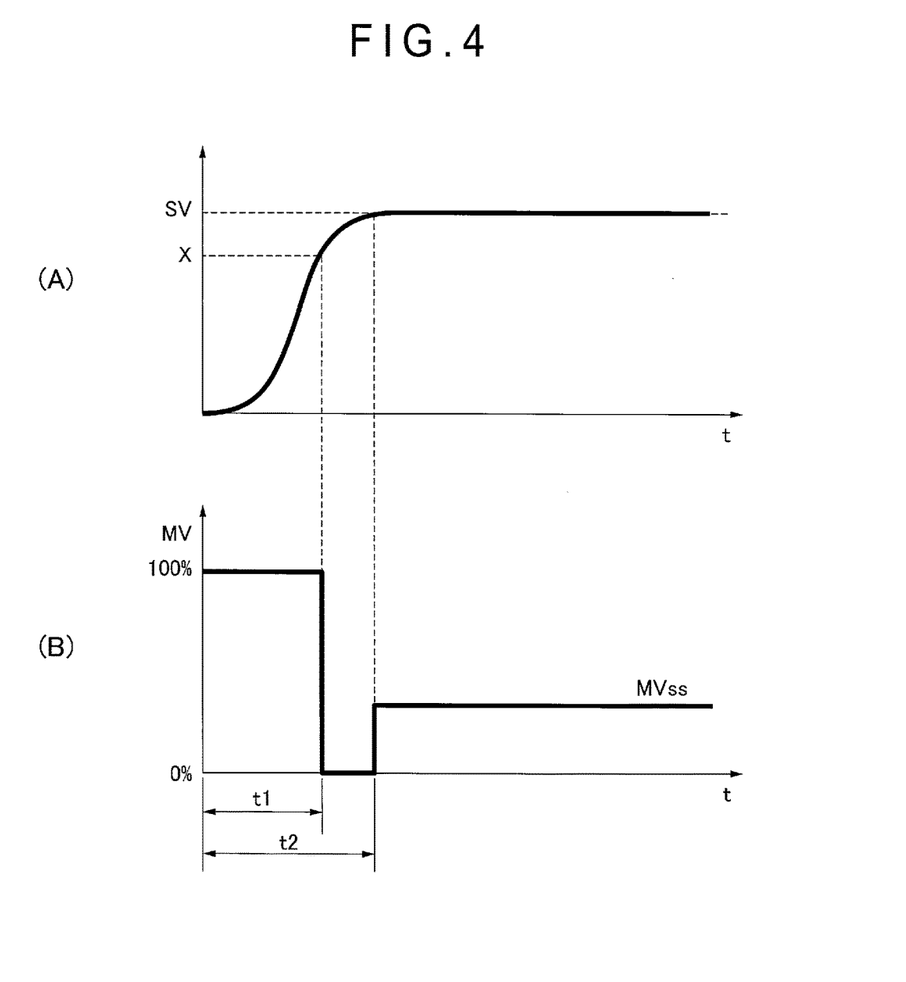
FIG. 4 is a graph for explaining a reference model in the exemplary embodiment.

As shown in FIG. 4, a manipulated variable pattern for reaching a temperature setpoint SV in the shortest time is achieved by accelerating with the maximum manipulated variable to an intermediate point X, decelerating with the minimum manipulated variable from the point X to the temperature setpoint SV, and switching the minimum manipulated variable to a manipulated variable MVss required for keeping a current level after reaching the temperature setpoint SV.

Figure 5A:
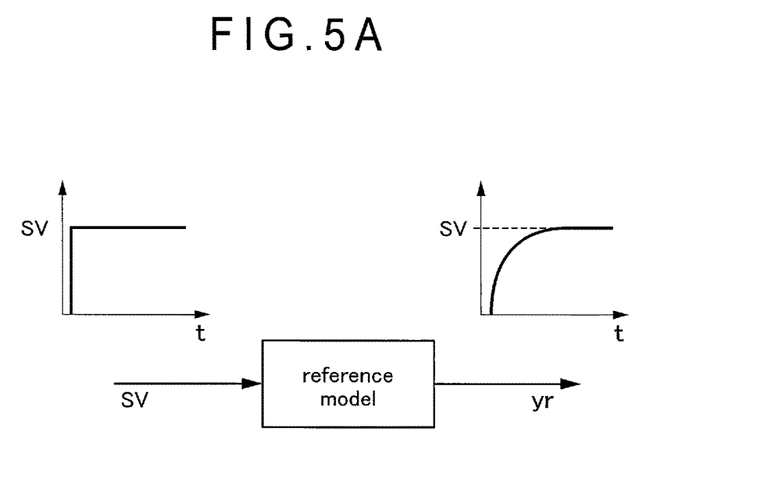
FIG. 5A is a diagram for explaining generation of the reference model in the exemplary embodiment.

When this manipulated variable pattern is inputted to a plant model, the plant should reach a setpoint in the shortest time. Accordingly, although a step input is only given to a transfer function showing a desirable step response in a typical model following control as shown in FIG. 5A, it is considered to input a manipulated variable pattern for controlling in the shortest time to the plant model itself as shown in FIG. 5B.

Figure 5B:
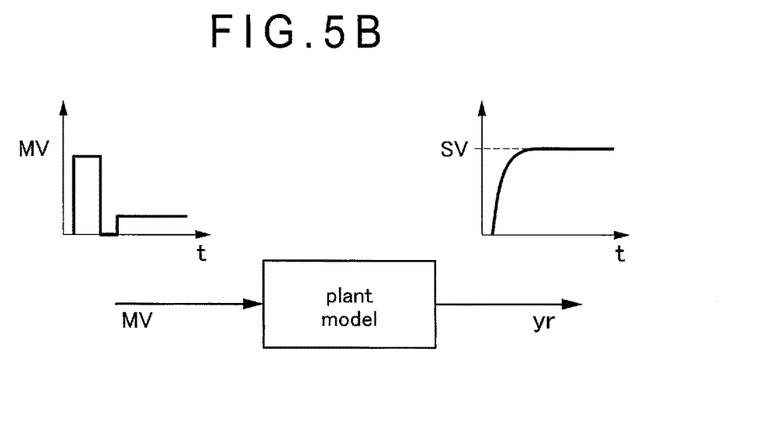
FIG. 5B is another diagram for explaining generation of the reference model in the exemplary embodiment.

In the multi-input multi-output system, the number of the manipulated variable patterns as shown in FIG. 5B needs to be equal to the number of the control loops. Moreover, unless the control variables of the respective control loops are uniform under interaction, the reference trajectory to be followed is also not uniform. Since it is very difficult to make such manipulated variable patterns only in a combination of step signals, the following method is taken. (1) Using a plant model Gp(s) or an actual plant, the maximum speed response is determined while keeping uniformity of the control variables of the respective control loops. A 100% maximum manipulated variable MVmax is given to a first zone at the slowest speed response among three zones. The remaining two zones are each given a manipulated variable at which the remaining two zones realize the maximum speed while keeping uniformity when following the first zone.

(2) The control loop having the slowest speed response is selected from response waveforms obtained in (1). Assuming that the slowest speed response of the control loop is a response by a step input, a reference model Gm(s) of a dead time+a first-order lag system is obtained by a system identification.

(3) With respect to the reference model Gm(s) obtained in (2), a manipulated variable for achieving an optimal time control is determined by sequential simulation. Herein, an optimal value of a switching time t1 is searched for as a value for switching the maximum manipulated variable to a steady state manipulated variable after the elapse of t1 seconds.

As an evaluation function used for searching for the optimal value, IAE (Integral of Absolute Error) evaluation model, for instance, represented by a formula (4) below is employed to search for a manipulated variable pattern allowable for the minimum evaluation function.

$$J=\int|SV-PV|dt \tag{4}$$

(4) By using the reference model Gm(s) for all the inputs and the outputs, the reference trajectory is used in common for all the control loops, so that uniformity of the control variables among the control loops can be expected. It is also possible to prepare reference models corresponding in number to the control loops and set different setpoints to the respective reference models.

Figure 6:
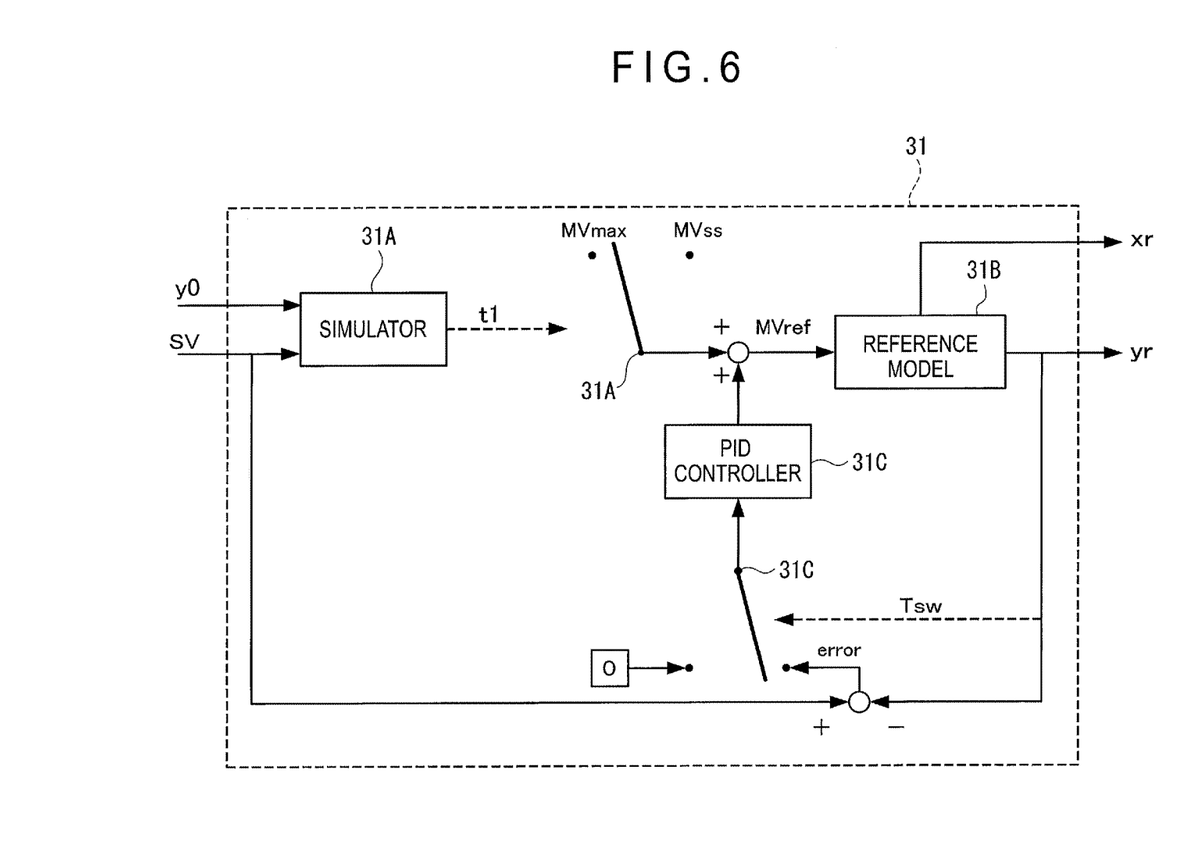
FIG. 6 is a block diagram showing a structure of a reference model output generator in the exemplary embodiment.

As shown in FIG. 6, the reference model output generator 31 serving as the reference model output generator includes a simulator 31A, a reference model 31B obtained in the above-described procedure, and a control switching unit 31C serving as a control switching unit. Unlike a typical method, an input of the reference model 31B is not an input of the temperature setpoint, but an input of a manipulated variable pattern made having the same dimension as that of the control target 2.

Accordingly, it is necessary to change the temperature setpoint SV to the corresponding manipulated variable pattern MVref.

The simulator 31A serving as the optimal manipulated variable pattern searching unit sequentially searches for the switching time t1 when the temperature setpoint SV is inputted, and determines the manipulated variable pattern MVref for switching from the maximum manipulated variable MVmax to the manipulated variable MVss. Although the optimal time is sequentially searched for online by the simulator 31A in the exemplary embodiment, the optimal time may be obtained in any manner. A table of the manipulated variable pattern for a control target, in which the temperature setpoint SV is associated with the optimal time for reaching the temperature setpoint SV in the shortest time, may be prepared offline in advance. When the temperature setpoint SV is inputted, the optimal manipulated variable pattern MVref may be selected with reference to the table.

Using the plant model Gp(s) or the actual plant as described above, the reference model 31B determines the maximum speed response achievable while keeping the control variables of the respective control loops, and gives the 100% manipulated variable to the slowest response speed zone. For instance, the reference model 31B is expressed by a dead time+a first-order lag system as represented by a formula (5) below.

$$Gm(s)=\frac{K}{Ts+1}\cdot e^{-Ls} \tag{5}$$

The control switching unit 31C includes a switching unit and a PID controller. The control switching unit 31C is configured to acquire a reference model output yr outputted from the reference model 31B and feeds back to the manipulated variable pattern MVref an error between the reference model output yr and the temperature setpoint SV when the temperature reaches a predetermined temperature Tsw after the output of the reference model 31B starts, thereby bringing the reference model output yr into complete conformity with the temperature setpoint SV. Although the feed-back control is switched depending on whether or not the temperature reaches the predetermined temperature Tsw in the exemplary embodiment, the feed-back control may be switched at a timing of a predetermined time Tsw.

3. Operations in Embodiment(s)

Figure 7:
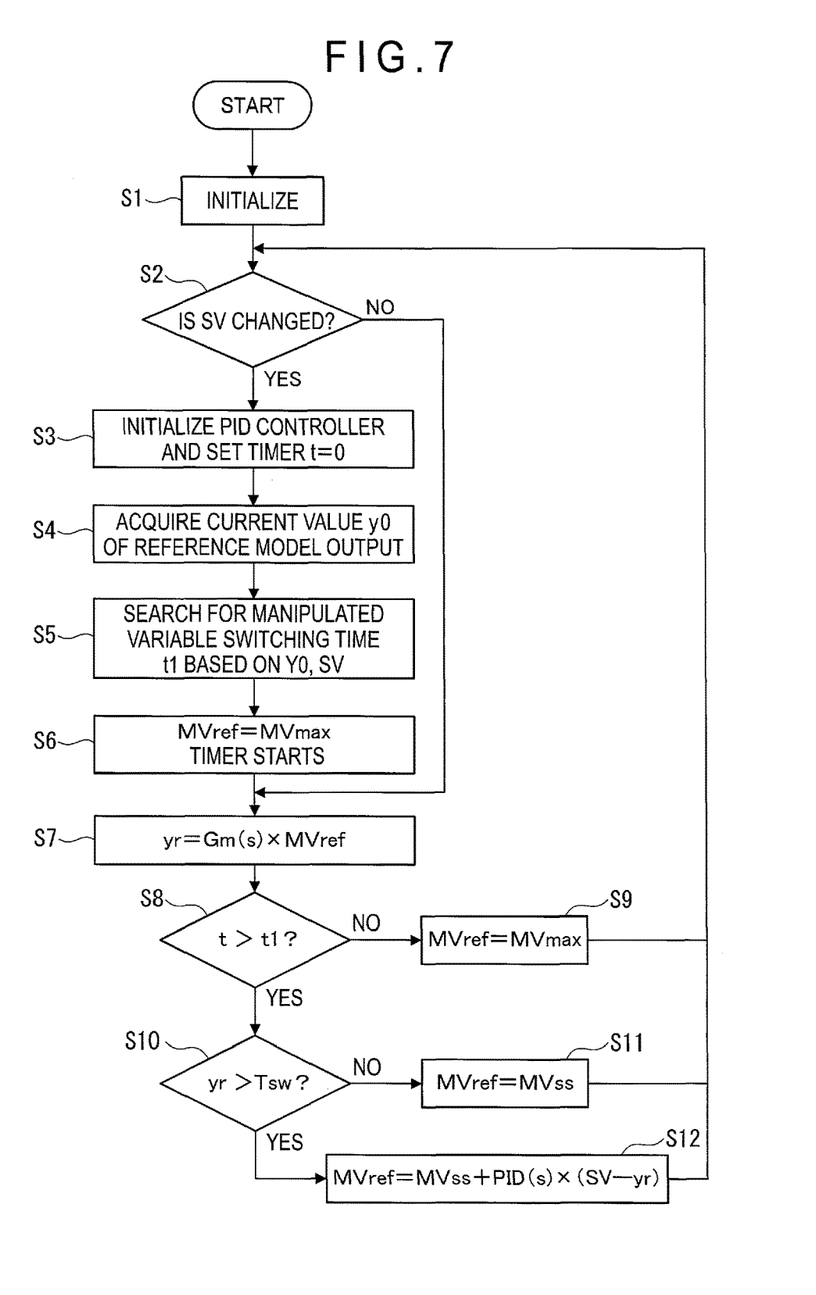
FIG. 7 is a flow chart for explaining an operation in the exemplary embodiment.

Next, a temperature control method of a semiconductor wafer in the exemplary embodiment will be described with reference to a flow chart shown in FIG. 7.

The manipulated variable calculator 30 of the controller 24 drives and initializes an apparatus (Step S1).

The manipulated variable calculator 30 judges whether the temperature setpoint SV is changed or not (Step S2). When the temperature setpoint SV is not changed, the manipulated variable calculator 30 generates a reference model output yr in Step S7 described later and continues controlling.

When the temperature setpoint SV is changed, the control switching unit 31C initializes the PID controller and resets a timer to zero (Step S3).

The simulator 31A acquires a current value y0 of the reference model output (Step S4) and searches for the switching time t1 based on y0 and SV (Step S5).

After the switching time t1 is searched for, the simulator 31A inputs MVref=MVmax to the reference model 31B.

The reference model 31B multiplies the generated reference model Gm(s) by the manipulated variable pattern MVref to obtain a reference model output and outputs the reference model output (Step S7).

The simulator 31A monitors the timer and judges whether the switching time t1 has passed (Step S8). When judging that the switching time t1 has not passed, the simulator 31A continues to output MVref=MVmax to the reference model 31B (Step S9).

When judging that the switching time t1 has passed, the control switching unit 31C judges whether the reference model output yr reaches the predetermined temperature Tsw (Step S10).

When judging that the reference model output yr has not reached the predetermined temperature Tsw, the control switching unit 31C sets MVref=MVss (Step S11).

When judging that the reference model output yr has reached the predetermined temperature Tsw, the control switching unit 31C feeds back the error between the temperature setpoint SV and the reference model output yr to the PID controller and adds the output of the PID controller to MVss (Step S12).

The thus set manipulated variable is outputted at a next sampling time.

Figure 8:
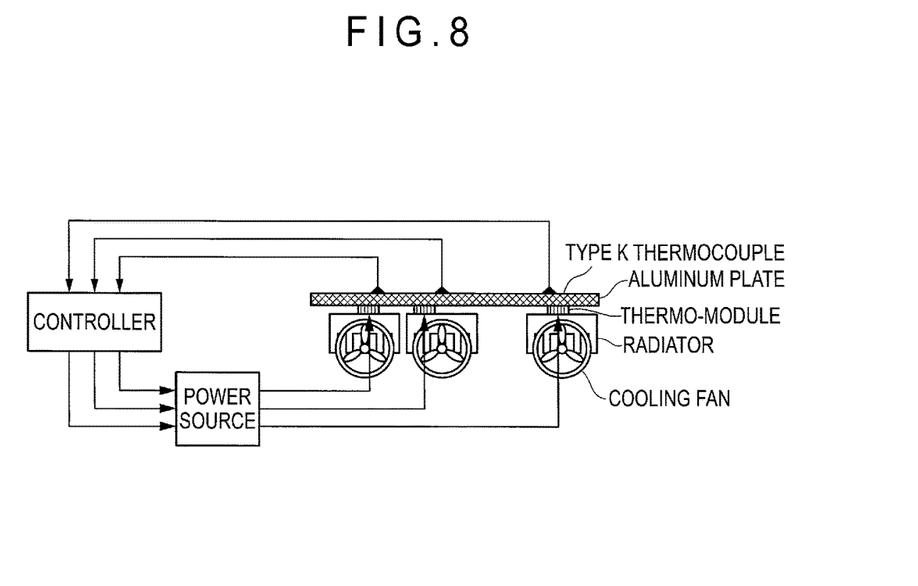
FIG. 8 is a diagram showing a control system used for simulation for checking effects in the exemplary embodiment.
Figure 9:
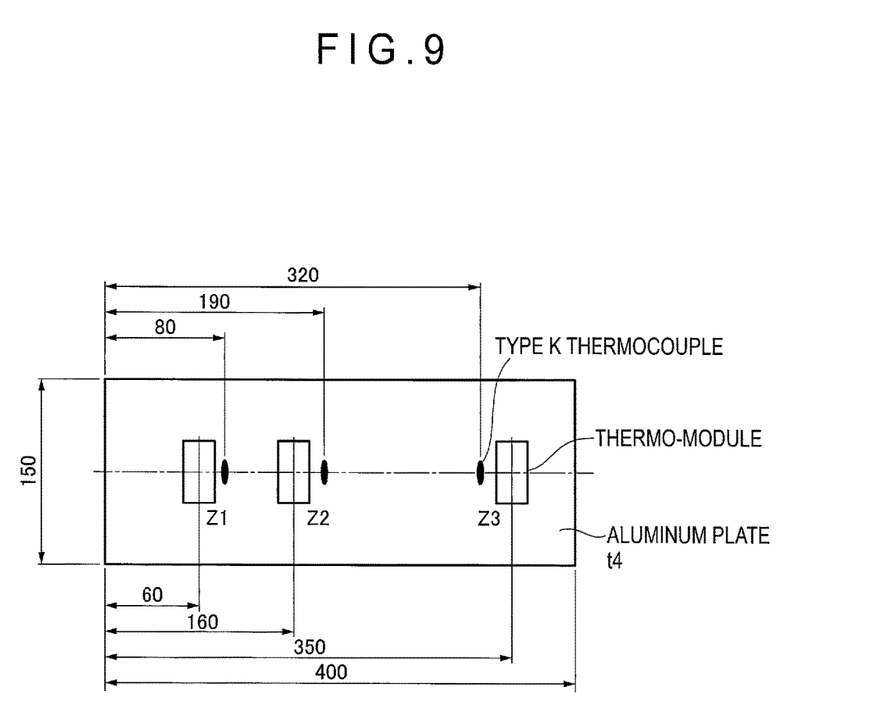
FIG. 9 is a plan view showing the control system used for simulation for checking the effects in the exemplary embodiment.

4. Check of Effects of Invention by Simulation 4-1. Structure of Control System in Simulation Control of a three-input three-output system will be exemplarily described with a simulation result obtained by modeling a control system shown in FIG. 8. This control system is a system for controlling a temperature of an aluminum plate of 400×150×t4 as shown in FIG. 9 and uses an actuator in a form of three thermo-modules configured to heat and cool the plate. The temperature of the aluminum plate is measured by three type K thermocouples provided near the respective modules. The thermo-module and the thermocouples are intentionally disposed asymmetrically relative to a longitudinal direction of the plate, which is shown in dimensional detail in FIG. 9. Zones 1, 2 and 3 are defined from the left in the figure.

4-2. Problems in Patent Literature 1

The reference model in Patent Literature 1 will be described in detail with respect to the identification method of the switching time when the reference model in Patent Literature 1 is defined as a dead time+a first-order lag system represented by a formula (6).

$$G_m(s) = \frac{44.2}{178\,s+1} e^{-4s} \qquad (6)$$

By replacing the dead time with a first-order Padé approximation in the formula (6), the formula (21) is represented by a formula (7).

$$G_m(s) = \frac{-44.2\,s + 22.1}{178\,s^2 + 90\,s + 0.5} \qquad (7)$$

When the formula (7) is further converted to a state equation of a discrete-time system (the sampling time: 0.1 second), the formula (7) is represented by formulae (8) and (9).

$$\begin{bmatrix} x_1(k+1) \\ x_2(k+1) \end{bmatrix} = \begin{bmatrix} 1.951 & -0.9507 \\ 1 & 0 \end{bmatrix} \begin{bmatrix} x_1(k) \\ x_2(k) \end{bmatrix} + \begin{bmatrix} 0.25 \\ 0 \end{bmatrix} u(k) \qquad (8)$$

$$y(k) = [\,-0.09441 \quad 0.09926\,] \begin{bmatrix} x_1(k) \\ x_2(k) \end{bmatrix} \qquad (9)$$

Considering the response in the formulae (8) and (9), since initial conditions differ depending on the heating starting temperature (defined as y0), it is necessary to input two of the heating starting temperature y0 and the temperature setpoint SV in order to search for the switching time t1. Here, assuming that the heating starting temperature y0 is steady, the initial conditions $x_1(0)$ and $x_2(0)$ at the heating starting temperature y0 are represented by a formula (10).

$$\begin{bmatrix} x_1(0) \\ x_2(0) \end{bmatrix} = \begin{bmatrix} C \\ CA \end{bmatrix}^{-1} \begin{bmatrix} y0 \\ y0 \end{bmatrix} \qquad (10)$$

A and C correspond to coefficient matrixes (see formula (11)) in the formulae (8) and (9).

$$A = \begin{bmatrix} 1.951 & -0.9507 \\ 1 & 0 \end{bmatrix}, B = \begin{bmatrix} 0.25 \\ 0 \end{bmatrix}, \qquad (11)$$

$$C = [\,-0.09441 \quad 0.09926\,]$$

The switching time t1 is searched for in the heating (cooling) range expectable according to the formulae (8) to (10). Consequently, a two-dimensional table in which an input is represented by y0 and SV and an output is represented by the switching time t1 is obtained. Table 1 shows an example of the two-dimensional table.

TABLE 1

| | SV | | | | | | | | | | |
|---|---|---|---|---|---|---|---|---|---|---|---|
| y0 | -10 | -5 | 0 | 5 | 10 | 15 | 20 | 25 | 30 | 35 | 40 |
| -15 | 15.2 | 32.2 | 51 | 72 | 95.9 | 123.5 | 156.4 | 196.9 | 249.7 | 325.6 | 462.9 |
| -10 | 0 | 16.7 | 35.6 | 56.6 | 80.4 | 108.1 | 141 | 181.5 | 234.3 | 310.2 | 447.4 |
| -5 | 0 | 0 | 18.7 | 39.7 | 63.5 | 91.2 | 124.1 | 164.6 | 217.4 | 293.3 | 430.5 |
| 0 | 0 | 0 | 0 | 21 | 44.8 | 72.5 | 105.4 | 145.9 | 198.7 | 274.6 | 411.8 |
| 5 | 0 | 0 | 0 | 0 | 23.9 | 51.5 | 84.4 | 124.9 | 177.7 | 253.7 | 390.9 |
| 10 | 0 | 0 | 0 | 0 | 0 | 27.7 | 60.6 | 101.1 | 153.9 | 229.9 | 367.1 |
| 15 | 0 | 0 | 0 | 0 | 0 | 0 | 33 | 73.5 | 126.3 | 202.3 | 339.5 |
| 20 | 0 | 0 | 0 | 0 | 0 | 0 | 0 | 40.8 | 93.6 | 169.6 | 306.8 |
| 25 | 0 | 0 | 0 | 0 | 0 | 0 | 0 | 0 | 53.3 | 129.3 | 266.5 |
| 30 | 0 | 0 | 0 | 0 | 0 | 0 | 0 | 0 | 0 | 76.8 | 214.1 |
| 35 | 0 | 0 | 0 | 0 | 0 | 0 | 0 | 0 | 0 | 0 | 138.9 |

For instance, in the table showing that the heating starting temperature y0 is 10 degrees C. and the temperature setpoint SV is 30 degrees C., the switching time is 153.9 seconds. Since the input is given at every interval of 5 degrees C., temperatures in the interval are obtained by interpolation, but the interval may be decreased.

In the technology disclosed in Patent Literature 1, the maximum manipulated variable MVmax and the steady manipulated variable MVss are inputted to the reference model 31B before and after the switching time, and the switching time allowable for the minimum evaluation function represented by the formula (4), in other words, the switching time allowable for a small overshoot and a short setting time is searched for, however, the obtained results do not always completely conform with the setpoint.

Figure 10:
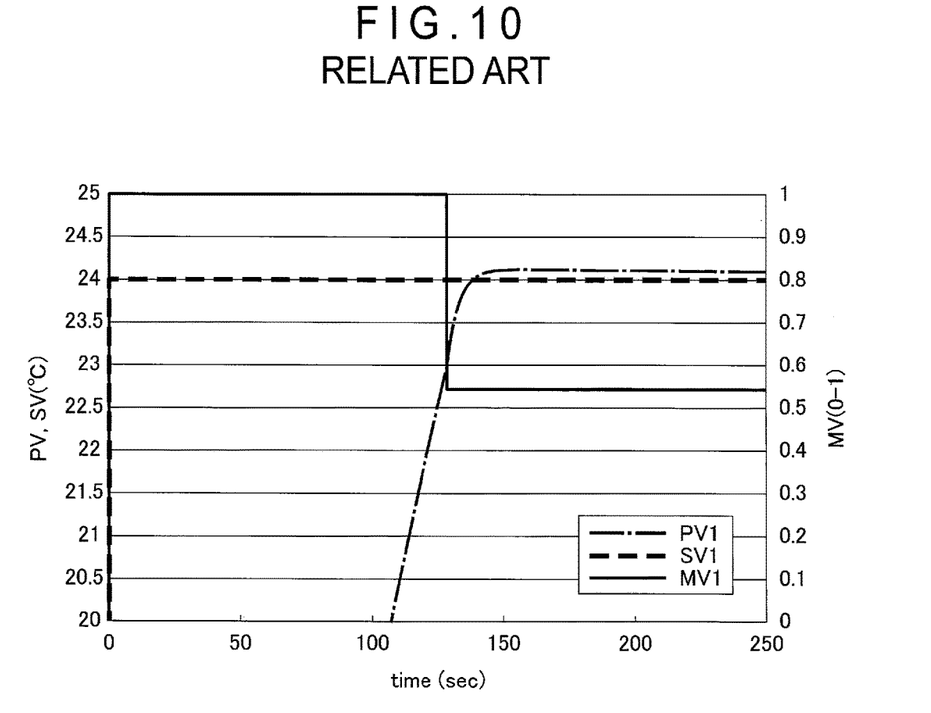
FIG. 10 is a graph showing simulation results in the related art.

Accordingly, there is a possibility that the steady reference model output yr has a minute error with respect to the temperature setpoint SV. As shown in specific simulation results in FIG. 10, a slight overshoot occurs after reaching the temperature setpoint of 24 degrees C. and the temperature setpoint has not been set at the time t=250 s. When the reference model output yr still has an error as described above, it follows that the control variable following the reference model output yr also has an error.

Figure 11:
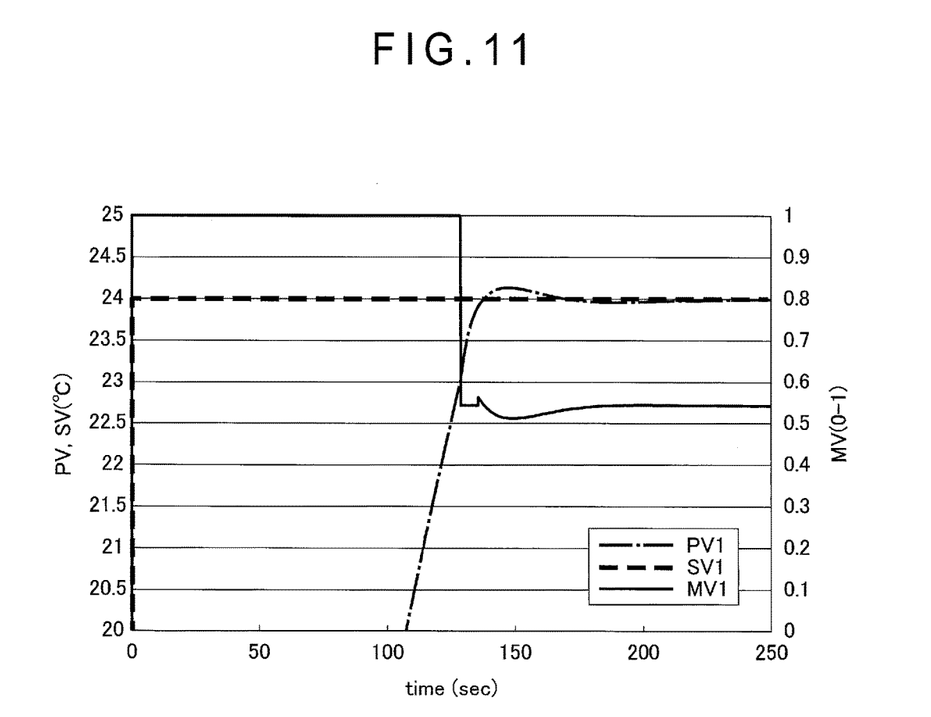
FIG. 11 is a graph showing simulation results in the exemplary embodiment.

However, in the simulation results in the exemplary embodiment, an error is fed back from the temperature of SV-0.1 degrees C. as shown in FIG. 11. After the elapse of about 125 seconds after the output of the manipulated variable starts, the maximum manipulated variable MVmax is switched to the steady manipulated variable MVss and further, a feedback compensation variable is added to the steady manipulated variable MVss from the temperature of 23.9 degrees C. Consequently, it is found that the reference model output yr has been set to the temperature setpoint SV without an error.

What is claimed is:

1. A temperature controller of a semiconductor wafer using a plurality of temperature adjusters, the temperature controller that controls temperatures of the respective temperature adjusters to adjust temperatures of the semiconductor wafer, the temperature controller comprising:

a plurality of control loops respectively set in the plurality of temperature adjusters;

a plurality of temperature detectors provided to the respective control loops and that detects the temperatures of the semiconductor wafer, the temperatures adjusted by the respective temperature adjusters; and a manipulated variable calculator device that calculates manipulated variables to be respectively given to the temperature adjusters of the control loops based on the temperatures detected by the temperature detectors, wherein the manipulated variable calculator device comprises a reference model generated based on a response in which, in the plurality of control loops, a manipulated variable of a first control loop is defined as 100% and the rest of the control loops is controlled to follow the first control loop, wherein the manipulated variable calculator device searches for, using the reference model, an optimal manipulated variable pattern for reaching a temperature setpoint, wherein the manipulated variable calculator device comprises a reference model output generator that gives to the reference model a manipulated variable of the optimal manipulated variable pattern, wherein the manipulated variable calculator device that uses an output of the reference model obtained by the reference model output generator as a reference model output using a model following servo control, wherein the manipulated variable calculator device feeds back an error between the reference model output and the temperature setpoint when the reference model output reaches a predetermined time or a predetermined temperature after the reference model output starts, thereby switching to a feed-back control to reset the error to zero, and wherein the manipulated variable calculator device brings the reference model output into conformity with the temperature setpoint in the model following servo control.

2. A temperature control method of a semiconductor wafer using a temperature controller comprising a plurality of temperature adjusters and that adjusts temperatures of the semiconductor wafer using the plurality of temperature adjusters, the temperature control method comprising:

controlling temperatures of the respective temperature adjusters to adjust temperatures of the semiconductor wafer, the temperature controller further comprising:

a plurality of control loops respectively set in the plurality of temperature adjusters;

a plurality of temperature detectors provided to the respective control loops and configured to detect the temperatures of the semiconductor wafer, the temperatures adjusted by the respective temperature adjusters; and a manipulated variable calculator device that calculates manipulated variables to be respectively given to the temperature adjusters of the control loops based on the temperatures detected by the temperature detectors, the manipulated variable calculator device executing:
  searching for an optimal manipulated variable pattern to reach a temperature setpoint with use of a reference model generated based on a response in which, in the plurality of control loops, a manipulated variable of a first control loop is defined as 100% and the rest of the control loops is controlled to follow the first control loop;
  giving to the reference model a manipulated variable of the searched optimal manipulated variable pattern;
  executing a model following servo control by using an output of the obtained reference model as a reference model output to calculate a manipulated variable with respect to a control target;
  feeding back an error between the reference model output and the temperature setpoint when the reference model output reaches a predetermined time or a predetermined temperature after the reference model output starts, thereby switching to a feed-back control to reset the error to zero; and
  bringing the reference model output into conformity with the temperature setpoint in the model following servo control.

\* \* \* \* \*